(12) United States Patent
Chang

(10) Patent No.: US 8,284,884 B2
(45) Date of Patent: Oct. 9, 2012

(54) METHOD OF FREQUENCY SEARCH FOR DCO AND DECODER USING THE SAME

(75) Inventor: Hsiang-Hui Chang, Taipei Hsien (TW)

(73) Assignee: Mediatek Inc., Hsin-Chu (TW)

( * ) Notice: Subject to any disclaimer, the term of this patent is extended or adjusted under 35 U.S.C. 154(b) by 1222 days.

(21) Appl. No.: 11/763,627

(22) Filed: Jun. 15, 2007

(65) Prior Publication Data

US 2007/0297488 A1    Dec. 27, 2007

Related U.S. Application Data

(60) Provisional application No. 60/805,603, filed on Jun. 23, 2006.

(51) Int. Cl.
*H04L 7/00* (2006.01)

(52) U.S. Cl. ........ 375/371; 375/362; 375/373; 375/375; 375/376

(58) Field of Classification Search .................. 375/371, 375/362, 373, 375, 376; 327/42, 105, 113, 327/156, 159; 331/11, 16, 17, 18, 25, 34, 331/179; 370/277, 311, 342; 455/76, 255, 455/260, 269

See application file for complete search history.

(56) References Cited

U.S. PATENT DOCUMENTS

| | | | | |
|---|---|---|---|---|
| 5,493,243 A * | 2/1996 | Ghoshal | ...................... | 327/158 |
| 5,727,038 A * | 3/1998 | May et al. | ..................... | 375/376 |
| 6,606,004 B2 * | 8/2003 | Staszewski et al. | ............. | 331/17 |
| 7,155,188 B2 * | 12/2006 | Noboru et al. | ................ | 455/255 |
| 7,496,170 B2 * | 2/2009 | Nelson | .......................... | 375/376 |

* cited by examiner

*Primary Examiner* — Dhaval Patel
(74) *Attorney, Agent, or Firm* — Thomas|Kayden

(57) ABSTRACT

A method of frequency search for a digitally controlled oscillator (DCO) with multiple sub-bands. The method comprises providing multiple workable pre-control codes, each control code comprising a most significant bit (MSB), corresponding to each frequency of the DCO for selection, selecting one of the workable pre-control codes according to the MSBs thereof, and providing the selected control code to the DCO.

24 Claims, 8 Drawing Sheets

METHOD OF FREQUENCY SEARCH FOR DCO AND DECODER USING THE SAME

This application claims the benefit of U.S. Provisional Application No. 60/805,603, filed on Jun. 23, 2006, incorporated herein by reference.

BACKGROUND OF THE INVENTION

1. Field of the Invention

The invention relates to a digitally controlled oscillator (DCO) and, in particular, to a method of frequency search for the DCO.

2. Description of the Related Art

With advances in deep-submicron technology, demand for high-performance and short time-to-market integrated circuits has dramatically grown. Scalable microprocessor and graphic-processor systems can be cost-effectively ported to advanced technologies to increase clocking rate, lower power dissipation, and reduce design turn-around time. Synchronization among IC modules has become critical. Thus, considerable effort has been focused on high-performance digital interface circuits to communicate with these digital systems. A digital PLL can migrate over different processes. Moreover, with benefits from scaling CMOS technologies, the digital PLL has a lower supply voltage and potential for improved power management.

FIG. 1 is a block diagram of a conventional digital PLL 100 comprising a time to digital converter (TDC) 110, a low pass filter (LF) 120, a digitally controlled oscillator (DCO) 130, and a divider 140. The time to digital converter (TDC) 110 receives a reference clock signal and converts the same to a digital signal. The low pass filter (LF) 120 receives the digital signal and generates a control code. The digitally controlled oscillator (DCO) 130 receives the control code to control an output frequency of an output signal. The output signal of the DCO 130 is received by the divider 140 and then fed back to the TDC 110.

FIG. 2A is a diagram of period (inverse of frequency) versus an output code of the low pass filter in a conventional digital PLL with a DCO. FIG. 2B is a diagram of period (inverse of frequency) versus a control code for the DCO in a conventional digital PLL with a DCO with non-overlapped sub-bands. However, for such digital PLLs, each output code of the low pass filter in FIG. 2A corresponds to a control code for the DCO in FIG. 2B. Referring to FIG. 2B, the digital PLL with the DCO with non-overlapped sub-bands suffers large frequency jump or frequency dead zones on boundaries of sub-bands.

FIG. 3A is a diagram of period (inverse of frequency) versus an output code of the low pass filter in a conventional digital PLL. FIG. 3B is a diagram of period (inverse of frequency) versus a control code for the DCO in a conventional digital PLL with a DCO with overlapped sub-bands. However, for such digital PLLs, each output code of the low pass filter in FIG. 3A corresponds to a control code for the DCO in FIG. 3B. Referring to FIG. 3B, the digital PLL with the DCO with overlapped sub-bands still suffers frequency dead zones on boundaries of sub-bands and is thus unable to accomplish frequency lock.

BRIEF SUMMARY OF THE INVENTION

An embodiment of a method of frequency search for a digitally controlled oscillator (DCO) with multiple sub-bands comprises providing multiple workable pre-control codes, each control code comprising a most significant bit (MSB), corresponding to each frequency of the DCO for selection, selecting one of the workable pre-control codes according to the MSBs thereof, and providing the selected control code to the DCO.

Also provided is an embodiment of a method of frequency search for a digitally controlled oscillator (DCO) with multiple sub-bands each corresponding to a first predetermined number of delay units, comprising dividing an output signal of a filter by a second predetermined number, wherein the second predetermined number is half of the first predetermined number, providing a quotient of the division and an integral part of a remainder of the division as first and second parts of a first workable pre-control code respectively, generating a first part of a second workable pre-control code by subtracting the first part of the first second workable pre-control code by one, generating a second part of the second workable pre-control code by adding the second part of the first second workable pre-control code by the second predetermined number, selecting one of the workable pre-control codes according to the first parts thereof, and providing the selected control code to the DCO.

Further provided is an embodiment of a method of frequency search for a digitally controlled oscillator (DCO) with multiple sub-bands each corresponding to a first predetermined number of delay units, comprising dividing an output signal of a filter by a second predetermined number, wherein the second predetermined number is half of the first predetermined number, providing a quotient of the division and an integral part of a remainder of the division as first and second parts of a first workable pre-control code respectively, generating a first part of a second workable pre-control code by adding the first part of the first second workable pre-control code by one, generating a second part of the second workable pre-control code by subtracting the second part of the first second workable pre-control code by the second predetermined number, selecting one of the workable pre-control codes according to the first parts thereof, and providing the selected control code to the DCO.

An embodiment of a decoder providing a control code for a digitally controlled oscillator (DCO) with multiple sub-bands comprises a first pre-control code generator, a second pre-control code generator, a comparator, and a multiplexer is also disclosed. The first pre-control code generator generates a first pre-control code comprising first and second parts. The second pre-control code generator generates a second pre-control code comprising first and second parts. The comparator receives the first parts of the first and second pre-control codes and generates a control signal. The multiplexer receives the first and second parts of the first and second pre-control codes and selects one of the same as the control code according to the control signal.

Also provided is an embodiment of a decoder providing a control code for a digitally controlled oscillator (DCO) with multiple sub-bands comprises a first pre-control code generator, a second pre-control code generator, a comparator, and a multiplexer. The second pre-control code generator is coupled to the first pre-control code generator. The comparator is coupled to the first and second pre-control code generators. The multiplexer is coupled to the comparator.

A method of frequency search for a digitally controlled oscillator (DCO) with multiple sub-bands is also disclosed. A digital PLL using the method does not suffer from frequency search problems caused by any initial condition or frequent switching among sub-bands when the digital PLL achieves locked state. Thus, the digital PLL needs no calibration circuits and has better jitter performance.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
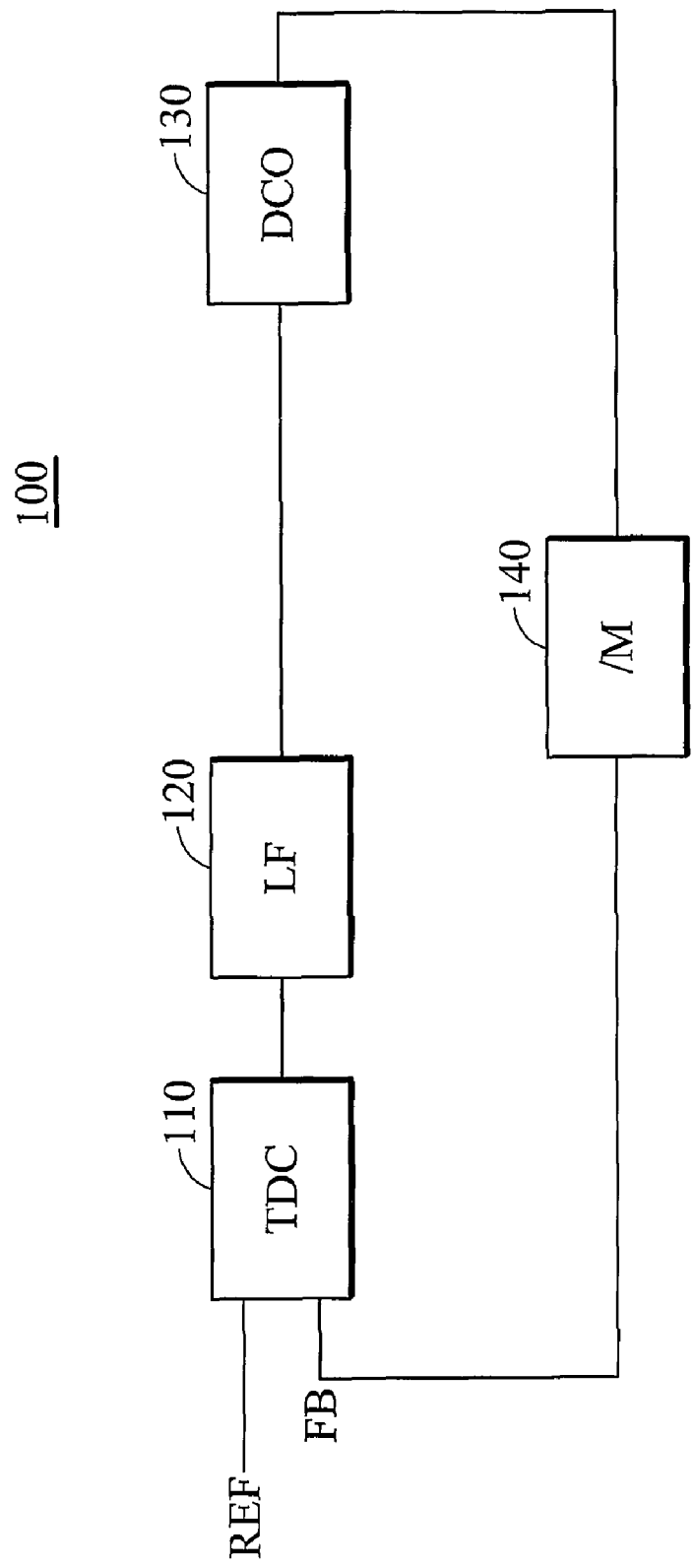
FIG. 1 is a block diagram of a conventional digital PLL comprising a time to digital converter (TDC), a low pass filter (LF), a digitally controlled oscillator (DCO), and a divider.
Figure 2A:
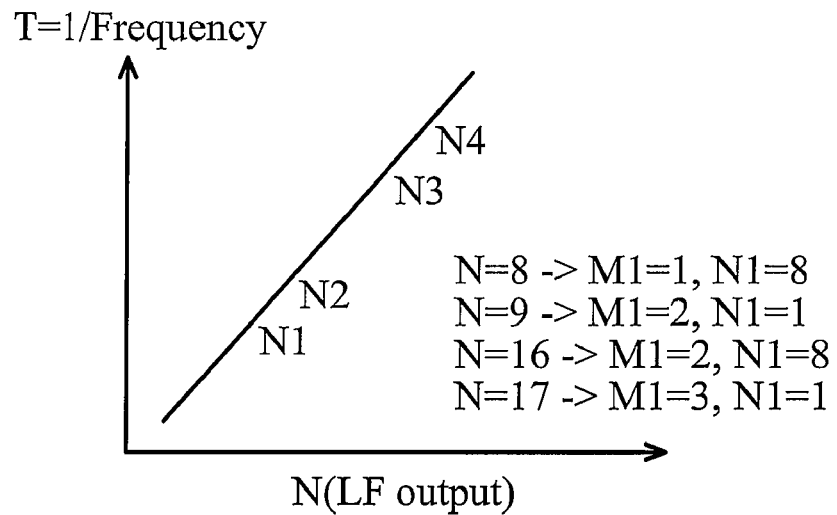
FIGS. 2A and 2B are respectively diagrams of period (inverse of frequency) versus an output code of the low pass filter and a control code for the DCO in a conventional digital PLL with a DCO without sub-bands or with non-overlapped ones.
Figure 2B:
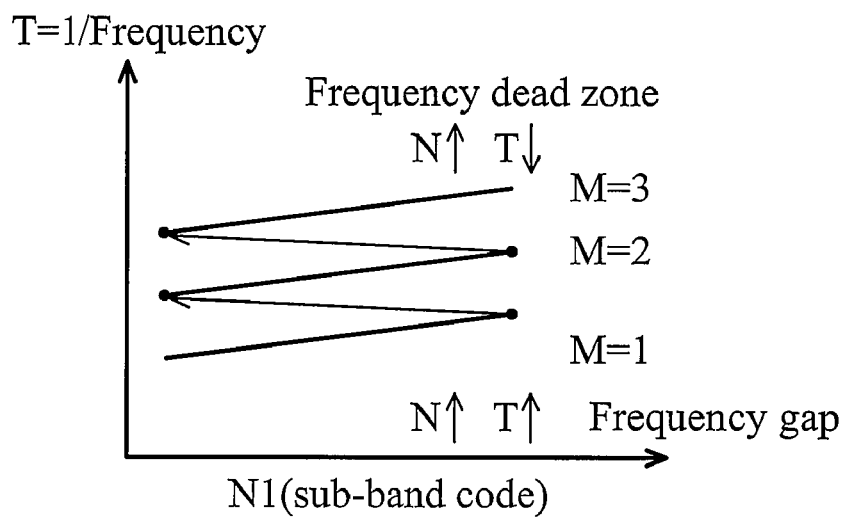
Figure 3A:
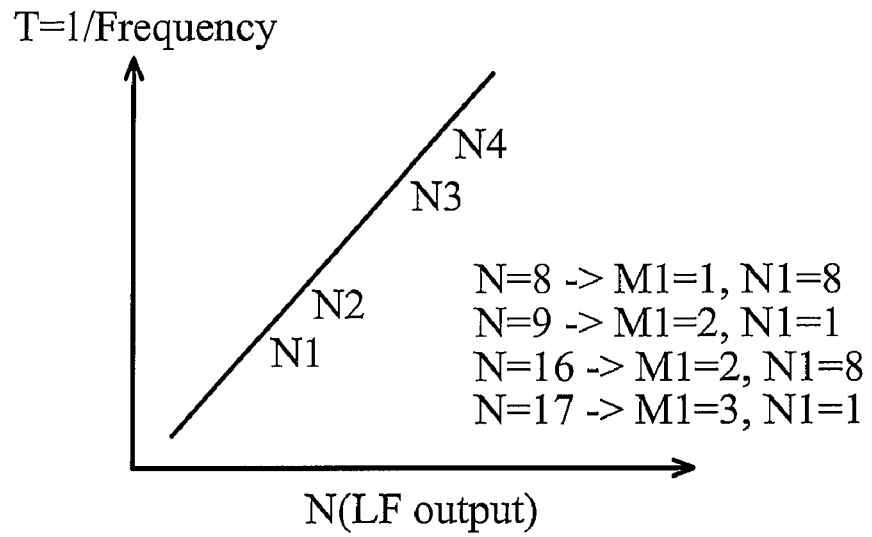
FIGS. 3A and 3B are respectively diagrams of period (inverse of frequency) versus an output code of the low pass filter and a control code for the DCO in a conventional digital PLL with a DCO with overlapped sub-bands or none at all.
Figure 3B:
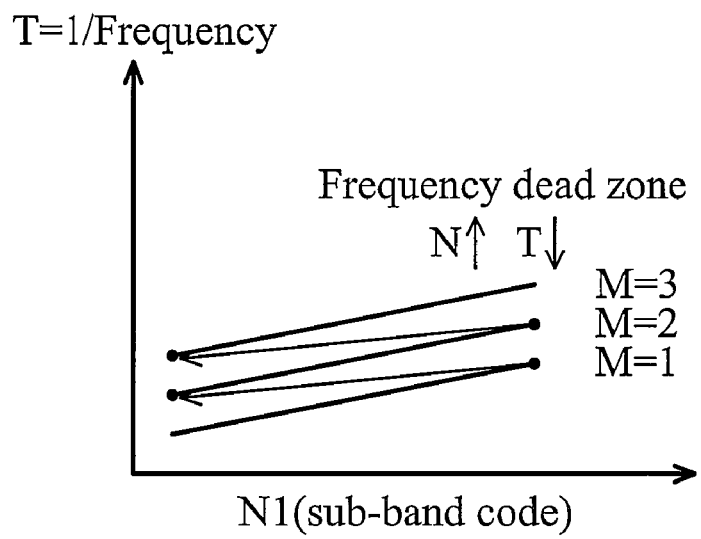
Figure 4:
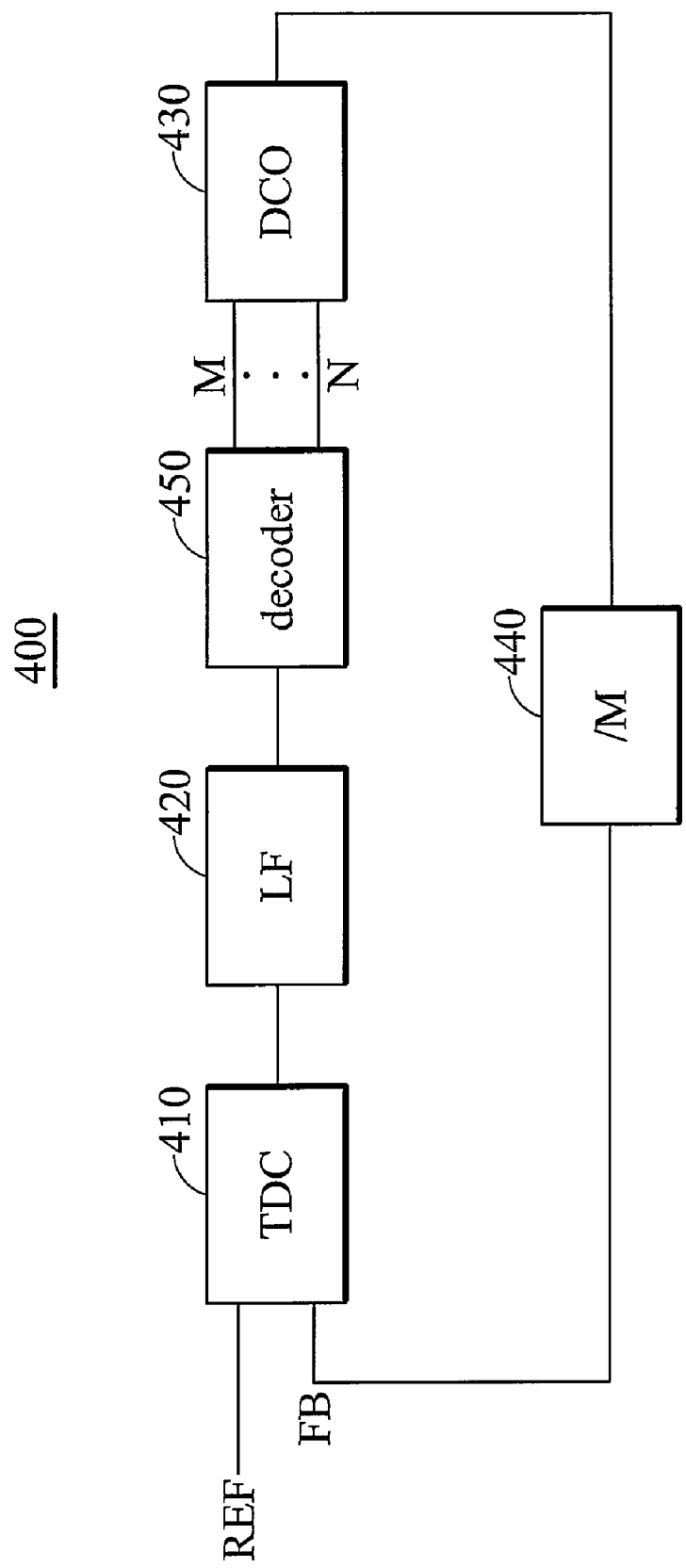
FIG. 4 is a block diagram of a digital PLL according to an embodiment of the invention.

FIG. 4 is a block diagram of a digital PLL 400 according to an embodiment of the invention. The digital PLL 400 comprises a time to digital converter (TDC) 410, a low pass filter (LF) 420, a decoder 450, a digitally controlled oscillator (DCO) 430, and a divider 440. The time to digital converter (TDC) 410 receives a reference clock signal and converts the same to a digital signal. The low pass filter (LF) 420 receives the digital signal and generates an output code. The decoder 450 receives the output code of the low pass filter 420 and generates a control code. The digitally controlled oscillator (DCO) 430 receives the control code to control the output frequency of an output signal. The control code comprises a first part (or a most significant bit; MSB) M and a second part N. The output signal of the DCO 430 is received by the divider 440 and then fed back to the TDC 410.

Figure 5A:
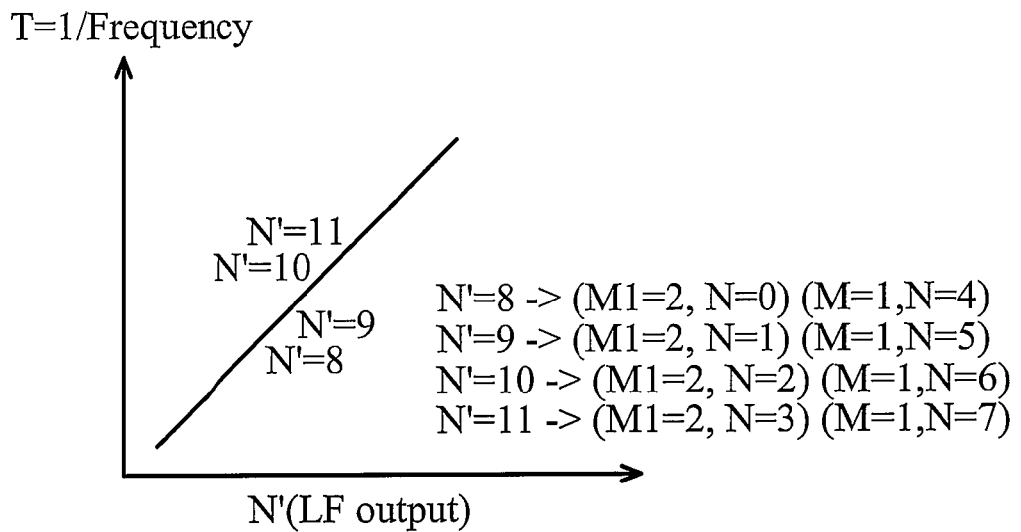
FIGS. 5A and 5B are respectively diagrams of period (inverse of frequency) versus the output code of the low pass filter and the control code for the DCO in the digital PLL in FIG. 4.
Figure 5B:
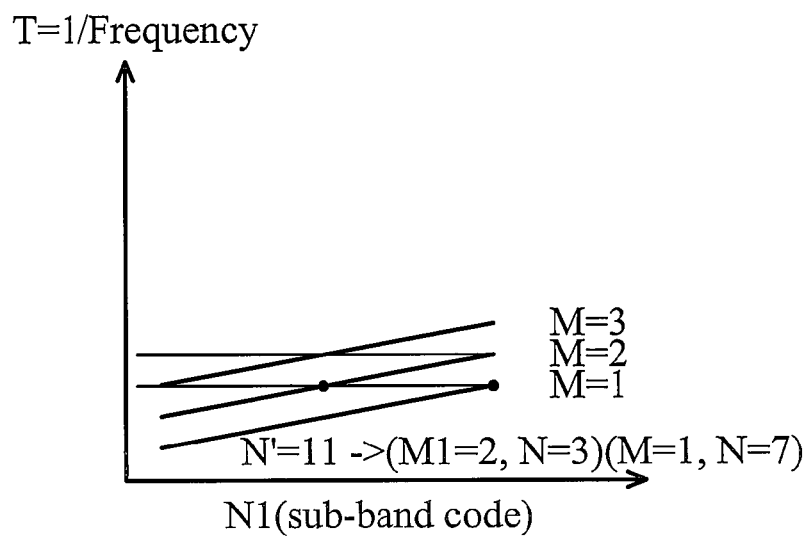

FIGS. 5A and 5B are respectively diagrams of period (inverse of frequency) versus the output code of the low pass filter and the control code for the DCO in the digital PLL in FIG. 4. Each output code of the low pass filter corresponds to two workable pre-control codes for the DCO. Each workable pre-control code comprises a first part (or a most significant bit; MSB) M and a second part N. In this embodiment, overlap between adjacent sub-bands is 50%. In other words, total delay range of one sub-band is twice of the delay change caused by one sub-band switching between adjacent sub-bands.

Figure 6A:
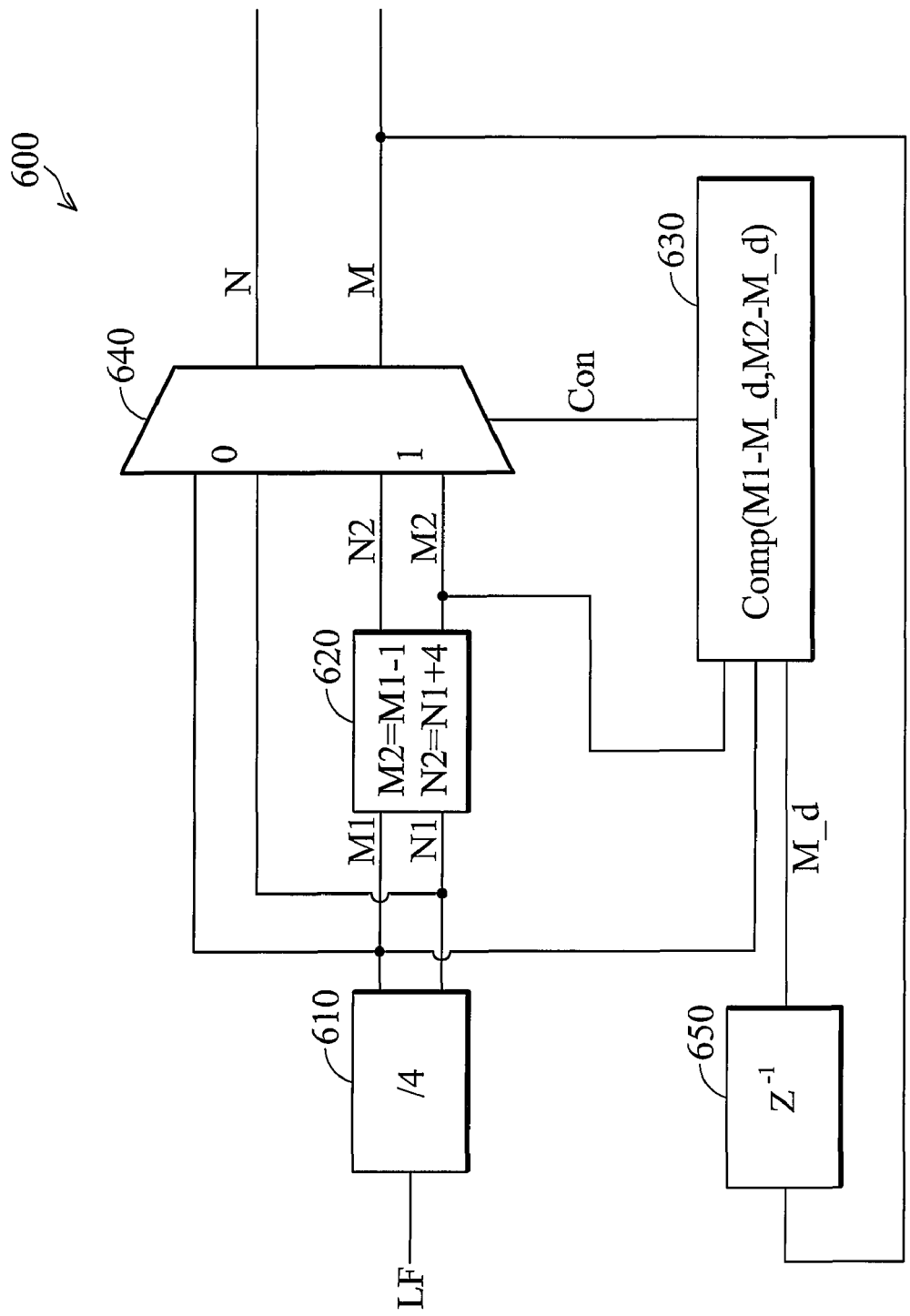
FIGS. 6A and 6B are respectively block diagrams of feasible decoders according to an embodiment of the invention in the digital PLL in FIG. 4.
Figure 6B:
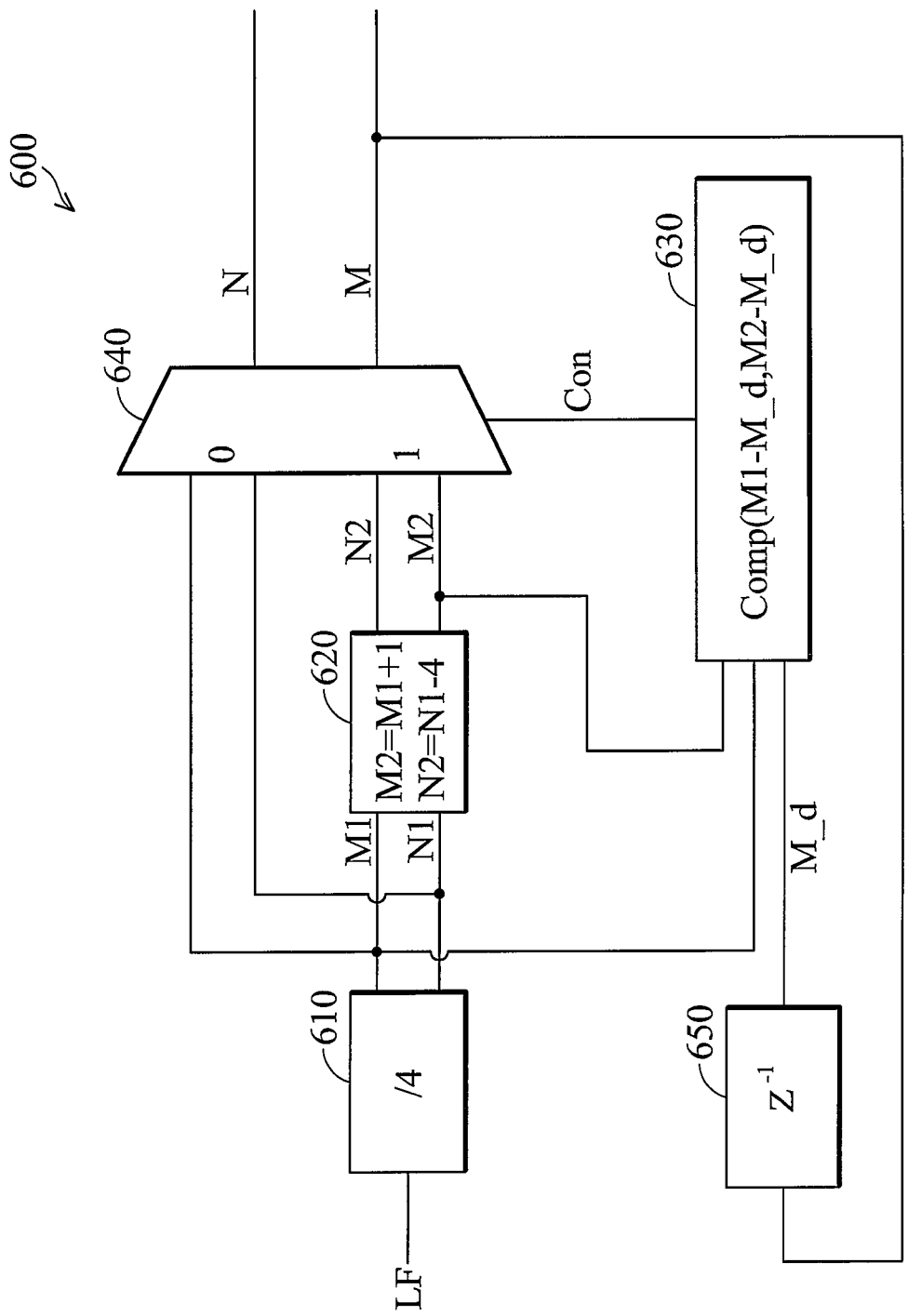

FIGS. 6A and 6B are respectively block diagrams of feasible decoders according to an embodiment of the invention in the digital PLL in FIG. 4. Referring to FIG. 6A, the decoder 600 comprises a first pre-control code generator 610, a second pre-control code generator 620, a comparator 630, and a multiplexer 640. The first pre-control code generator 610 is coupled to the low pass filter LF in FIG. 4. The second pre-control code generator 620 is coupled to the first pre-control code generator 610. The comparator 630 is coupled to the first pre-control code generator 610 and the second pre-control code generator 620. The multiplexer 640 is coupled to the comparator 630 and controlled thereby.

The first pre-control code generator 610 receives the output code from the low pass filter LF and generates a first pre-control code comprising a first part M1 and a second part N1. The second pre-control code generator 620 receives the first and second parts for the first pre-control code and generates a second pre-control code comprising a first part M2 and a second part N2 according thereto. The comparator 630 receives the first parts M1 and M2 of the first and second pre-control codes and generates a control signal CON. The multiplexer 640 receives the first and second parts (M1, N1, M2, and N2) of the first and second pre-control codes and selects one of first and second pre-control codes as the control code according to the control signal CON.

In this embodiment, the total delay time of one sub-band is equal to 8 delay units while the delay change caused by one sub-band switching is 4 delay units. Referring to FIG. 6A, the first pre-control code generator is a divider and divides the output code from the filter by 4. Results of division are given by (M1, N1), wherein M1 is a quotient of division and N1 is an integral part of a remainder of division. M1 indicates which sub-band should be selected and N1 indicates which stage should be used in the selected sub-band.

Referring to FIG. 6A, generation of the first part M2 and the second part N2 of the second control code is described by the formulae, M2=M1−1 and N2=N1+4. As a result, the periods of the DCO set by the first and second control codes ((M1, N1) and (M2, N2)) are the almost same if overlap between adjacent sub-bands is 50%. When the digital PLL tries to lock the desired frequency, one register records a first part M, the number of sub-band, of the control code in the most recent cycle. The first parts M1 and M2 of the first and second pre-control codes in the present cycle are compared with the first part M of the control code in a most recent cycle, respectively. If the value of |M1−M| is less than that of |M2−M|, the controller will chose (M1, N1) as the outputs. In other words, the pre-control code with a minimum difference between the first parts thereof and the previously selected control code is selected as the control code for the present cycle. Alternatively, generation of the first part M2 and the second part N2 of the second control code may be described by the formulae M2=M1+1 and N2=N1−4 as shown in FIG. 6B.

In this embodiment, providing 8 units in one sub-band is merely an example. Designers are able to design a DCO where each sub-band has more or less delay units. For example, in another embodiment, 16 delay units can be used in each sub-band and the output code from the filter is divided by 8. The formula N2=N1+4 in FIG. 6A would change to N2=N1+8 and the formula N2=N1−4 in FIG. 6B would change to N2=N1−8.

Table 1 shows one example of a method of multiple-path frequency search for a digitally controlled oscillator (DCO) with multiple sub-bands. It is assumed that the optimum control code is 44. The digital PLL may search in an "up" way. According to the disclosed method, (M, N) is switched from (10, 3) to (10, 4) rather than (11, 0) during transition from Step3 to Step4. Due to the dynamic of the PLL, the control code finally stabilizes and a lock state of the digital PLL is achieved.

TABLE 1

Bi-path frequency search algorithm

| LF output | Path 1 M1 | UP N1 search | DN search | Path 2 M2 | UP N2 search | DN search |
|---|---|---|---|---|---|---|
| 56 | 14 | 0 |  | 13 | 4 |  |
| 55 | 13 | 3 |  | 12 | 7 |  |
| 54 | 13 | 2 |  | 12 | 6 |  |
| 53 | 13 | 1 |  | 12 | 5 |  |
| 52 | 13 | 0 |  | 12 | 4 |  |
| 51 | 12 | 3 |  | 11 | 7 | Step 11 |
| 50 | 12 | 2 |  | 11 | 6 | Step 10 | Step 12 |
| 49 | 12 | 1 |  | 11 | 5 | Step 9 | Step 13 |
| 48 | 12 | 0 |  | 11 | 4 | Step 8 | Step 14 |
| 47 | 11 | 3 | Step 16 | 10 | 7 | Step 7 |
| 46 | 11 | 2 | Step 16 | 10 | 6 | Step 6 |
| 45 | 11 | 1 | Step 17 | 10 | 5 | Step 5 |
| 44 | 11 | 0 | Step 18 | 10 | 4 | Step 4 |
| 43 | 10 | 3 | Step 3 | 9 | 7 |  |
| 42 | 10 | 2 | Step 2 | 9 | 6 |  |
| 41 | 10 | 1 | Step 1 | 9 | 5 |  |

Figure 7:
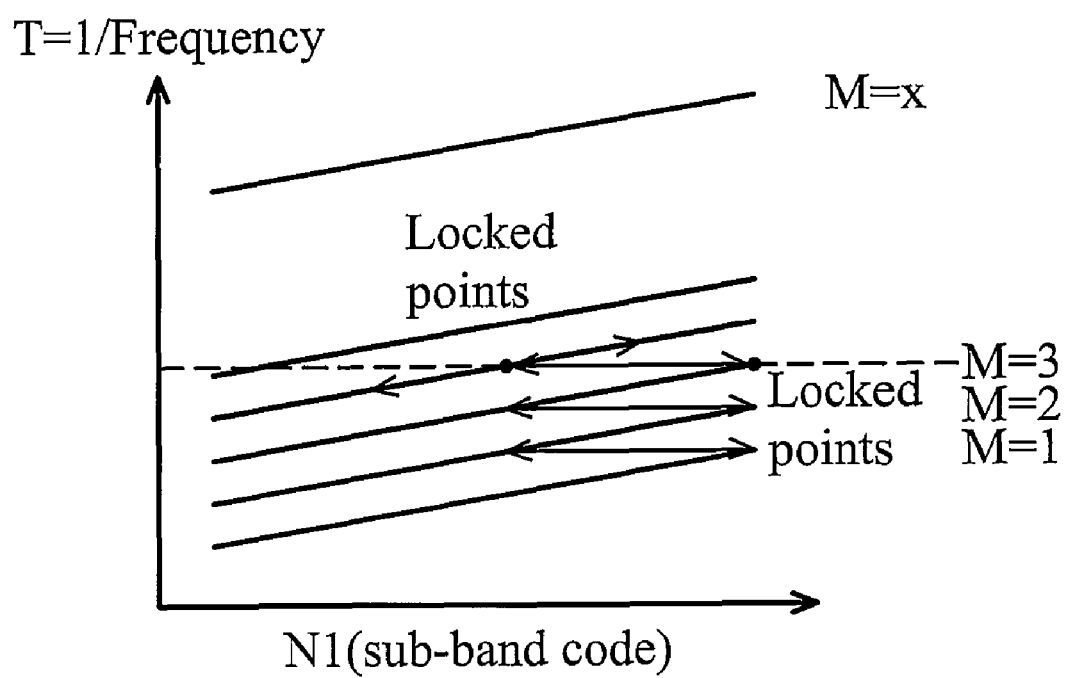
FIG. 7 shows lock transient of the digital PLL using the disclosed method.

FIG. 7 shows lock transient of the digital PLL using the disclosed method. As previously disclosed, there are two possible pre-control codes for the DCO. If one pre-control code is at an edge of a sub-band, then the other is located at a center of another. The state wherein the pre-control code at an edge of a sub-band is not stable and any jitter or perturbation may induce sub-band switching. After sub-band switching, the digital PLL stays in a state wherein the pre-control code is at a center of another sub-band and thus more stable. As a result, the locked point does not fall on any edge of any sub-band after the digital PLL is settled.

A method of frequency search for a digitally controlled oscillator (DCO) with multiple sub-bands is disclosed. A digital PLL using the method does not suffer from frequency search problems caused by any initial condition or frequent switching among sub-bands when the digital PLL achieves locked state. Thus, the digital PLL needs no calibration circuits and has better jitter performance.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of frequency search for a digitally controlled oscillator (DCO) with multiple sub-bands, the method comprising:
   dividing an output signal received from a loop filter to generate multiple workable pre-control codes corresponding to a frequency of the DCO for selection, wherein each pre-control code comprises a most significant bit (MSB);
   selecting one of the workable pre-control codes according to the MSBs thereof; and
   providing the selected pre-control code to the DCO.

2. The method as claimed in claim 1, wherein selection of the workable pre-control codes further comprises:
   comparing MSBs of each workable pre-control code with an MSB of a previously selected control code; and
   selecting the pre-control code with a minimum difference between the MSB of the pre-control code and the MSB of the previously selected control code.

3. The method as claimed in claim 2, wherein the previously selected control code is selected in a most recent cycle.

4. A method of frequency search for a digitally controlled oscillator (DCO) with multiple sub-bands each corresponding to a first predetermined number of delay units, comprising:
   dividing an output signal of a filter by a second predetermined number, wherein the second predetermined number is half of the first predetermined number;
   providing a quotient of the division and an integral part of a remainder of the division as first and second parts of a first workable pre-control code respectively;
   generating a first part of a second workable pre-control code by subtracting the first part of the first second workable pre-control code by one;
   generating a second part of the second workable pre-control code by adding the second part of the first second workable pre-control code by the second predetermined number;
   selecting one of the workable pre-control codes according to the first parts thereof; and
   providing the selected pre-control code to the DCO.

5. The method as claimed in claim 4, wherein selection of the workable pre-control codes further comprises:
   comparing the first parts of each workable pre-control code with a first part of a previously selected control code; and
   selecting the pre-control code with a minimum difference between the first part of the pre-control code and the first part of the previously selected control code.

6. The method as claimed in claim 5, wherein the previously selected control code is selected in a most recent cycle.

7. A method of frequency search for a digitally controlled oscillator (DCO) with overlapped sub-bands each corresponding to a first predetermined number of delay units, comprising:
   dividing an output signal of a filter by a second predetermined number, wherein the second predetermined number is half of the first predetermined number;
   providing a quotient of the division and an integral part of a remainder of the division as first and second parts of a first workable pre-control code respectively;
   generating a first part of a second workable pre-control code by adding the first part of the first second workable pre-control code by one;
   generating a second part of the second workable pre-control code by subtracting the second part of the first second workable pre-control code by the second predetermined number;
   selecting one of the workable pre-control codes according to the first parts thereof; and
   providing the selected pre-control code to the DCO.

8. The method as claimed in claim 7, wherein selection of the workable pre-control codes further comprises:
   comparing the first parts of each workable pre-control code with a first part of a previously selected control code; and selecting the pre-control code with a minimum difference between the first part of the pre-control code and the first part of the previously selected control code.

9. The method as claimed in claim 8, wherein the previously selected control code is selected in a most recent cycle.

10. A decoder providing a control code for a digitally controlled oscillator (DCO) with multiple sub-bands, the decoder comprising:
   a first pre-control code generator dividing an output signal received from a loop filter to generate a first pre-control code comprising first and second parts;
   a second pre-control code generator generating a second pre-control code comprising first and second parts according to an output of the first pre-control code generator;
   a comparator receiving the first parts of the first and second pre-control codes and generating a control signal; and
   a multiplexer receiving the first and second parts of the first and second pre-control codes and selecting one of the same as the control code according to the control signal.

11. The decoder as claimed in claim 10, wherein the second pre-control code is generated according to the first pre-control code.

12. The decoder as claimed in claim 10, wherein the first pre-control code generator is a divider.

13. The decoder as claimed in claim 10, further comprising a delay receiving a first part of the control code from the multiplexer and providing the same to the comparator.

14. A decoder providing a control code for a digitally controlled oscillator (DCO) with multiple sub-bands, the decoder comprising:
   a first pre-control code generator arranged to receive an output signal of a filter and divide the output signal to generate a first pre-control code;
   a second pre-control code generator arranged to receive the first pre-control code of the first pre-control code generator;
   a comparator coupled to the first and second pre-control code generators; and
   a multiplexer coupled to the comparator.

15. The decoder as claimed in claim 14, wherein the second pre-control code generator is coupled to the filter via the first pre-control code generator.

16. The decoder as claimed in claim 14, wherein the first pre-control code generator is a divider.

17. The decoder as claimed in claim 16, further comprising a delay coupled between the multiplexer and the comparator.

18. A method of frequency search for a digitally controlled oscillator (DCO) with multiple sub-bands, comprising:
   dividing a current output signal of a filter to generate first and second workable pre-control codes at different frequency search paths for selection, respectively, wherein periods of the DCO set by the first and second workable pre-control codes are the almost same;
   selecting one of the first and second workable pre-control codes according to a previous output signal of the filter; and
   providing the selected pre-control code to the DCO.

19. The method as claimed in claim 18, wherein the step of selecting one of the first and second workable pre-control codes further comprises:
   comparing most significant bits (MSBs) of each workable pre-control code with an MSB of a previously selected control code generated by the previous output signal; and
   selecting the pre-control code with a minimum difference between the MSB of the pre-control code and the MSB of the previously selected control code.

20. The method as claimed in claim 18, wherein the step of dividing the current output signal of the filter to generate the first and second workable pre-control codes comprises:
   providing a quotient of division and an integral part of a remainder of division to serve as first and second parts of the first workable pre-control code respectively;
   generating a first part of the second workable pre-control code by adding or subtracting the first part of the first workable pre-control code by one; and
   generating a second part of the second workable pre-control code by subtracting or adding the second part of the first workable pre-control code by a predetermined number.

21. The method as claimed in claim 20, wherein the step of selecting one of the first and second workable pre-control codes further comprises:
   comparing the first parts of each workable pre-control code with a first part of a previously selected control code generated by the previous output signal; and
   selecting the pre-control code with a minimum difference between the first part of the pre-control code and the first part of the previously selected control code.

22. A method of frequency search for a digitally controlled oscillator (DCO) with multiple sub-bands, comprising:
   dividing a current output signal of a loop filter to determine first and second frequency search paths for a frequency of the DCO;
   selecting one of the first and second frequency search paths according to a previous frequency search path based on a previous output signal of the filter; and
   controlling the frequency of the DCO according to the selected frequency search path.

23. The method as claimed in claim 22, wherein the selected frequency search path is selected according to a path correlation between the first frequency search path and the previous frequency search path, and a path correlation between the second frequency search path and the previous frequency search path.

24. The method as claimed in claim 23, wherein the step of selecting one of the first and second frequency search paths further comprises:
   comparing first parts of workable pre-control codes at the first and second frequency search paths with a first part of a previously selected control code at the previous frequency search path to obtain the path correlations; and
   selecting the frequency search path with a minimum difference between the pre-control code and the previously selected control code.

* * * * *